United States Patent
Albertson et al.

(10) Patent No.: US 11,341,034 B2
(45) Date of Patent: May 24, 2022

(54) ANALYSIS OF VERIFICATION PARAMETERS FOR TRAINING REDUCTION

(71) Applicant: International Business Machines Corporation, Armonk, NY (US)

(72) Inventors: Chad Albertson, Rochester, MN (US); John Borkenhagen, Rochester, MN (US); Scott D. Frei, Rochester, MN (US); David G. Wheeler, Rochester, MN (US); Mark S. Fredrickson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 962 days.

(21) Appl. No.: 16/055,831

(22) Filed: Aug. 6, 2018

(65) Prior Publication Data

US 2020/0042434 A1 Feb. 6, 2020

(51) Int. Cl.
*G06F 11/36* (2006.01)
*G06K 9/62* (2022.01)
(Continued)

(52) U.S. Cl.
CPC ...... *G06F 11/3692* (2013.01); *G06F 11/3676* (2013.01); *G06F 11/3688* (2013.01); *G06F 30/20* (2020.01); *G06F 30/30* (2020.01); *G06F 30/3308* (2020.01); *G06K 9/6256* (2013.01); *G06K 9/6267* (2013.01); *G06N 3/04* (2013.01);
(Continued)

(58) Field of Classification Search
CPC .. G06N 3/02; G06N 3/04; G06N 3/08; G06N 3/084; G06N 20/00; G06N 20/10; G06N 20/20; G06F 11/3676; G06F 11/3688; G06F 11/3692; G06F 30/20; G06F 30/30;
(Continued)

(56) References Cited

U.S. PATENT DOCUMENTS

| 8,374,974 B2 | 2/2013 | Chen et al. |
| 2017/0154262 A1 | 6/2017 | Sussillo et al. |

(Continued)

OTHER PUBLICATIONS

Reza Raeisi, Modeling and Verification of Digital Logic Circuit Using Neural Networks, American Society for Engineering Education, Apr. 1-2, 2005, 2005 IL/IN Sectional Conference, pp. 1-10 (Year: 2005).*

(Continued)

*Primary Examiner* — Shane D Woolwine

(74) *Attorney, Agent, or Firm* — Patterson + Sheridan, LLP

(57) ABSTRACT

Techniques for analysis of verification parameters and reduction of training data are provided. A plurality of test results is received, where each of the plurality of test results specifies a respective one or more parameters and a respective one or more events. A list of parameters used to stimulate computing logic is determined. Additionally, a plurality of relevant parameters is generated, corresponding to parameters in the list of parameters that have at least two distinct values specified in the plurality of test results. A plurality of training cases is generated based on the plurality of test results and the plurality of relevant parameters. Further, a neural network is generated for design verification of the computing logic based on the plurality of relevant parameters. The neural network is trained based on the plurality of training cases.

17 Claims, 10 Drawing Sheets

(51) Int. Cl.
*G06N 3/08* (2006.01)
*G06N 3/04* (2006.01)
*G06F 30/20* (2020.01)
*G06F 30/30* (2020.01)
*G06V 10/82* (2022.01)
*G06F 30/3308* (2020.01)

(52) U.S. Cl.
CPC .............. *G06N 3/08* (2013.01); *G06V 10/82* (2022.01); *G06N 3/084* (2013.01)

(58) Field of Classification Search
CPC .................. G06F 30/3308; G06K 9/6256; G06K 9/6267; G06V 10/82
See application file for complete search history.

(56) References Cited

U.S. PATENT DOCUMENTS

2018/0330493 A1* 11/2018 Milligan .............. G06N 3/0409
2019/0228691 A1* 7/2019 Bi ...................... G01R 31/2846

OTHER PUBLICATIONS

A. Hafid Zaabab, A Neural Network Modeling Approach to Circuit Optimization and Statistical Design, Jun. 1995, IEEE Transactions on Microwave Theory and Techniques, vol. 43, No. 6, pp. 1349-1358 (Year: 1995).*

Shai Fine and Avi Ziv, "Coverage Directed Test Generation for Functional Verification using Bayesian Networks," IBM Research Laboratory in Haifa DAC 2003, Jun. 2-6, 2003, ACM 1581136889/03/0001, 6 pages.

Cheng, Y., Wang, D., Zhou, P., & Zhang, T. (2017). A Survey of Model Compression and Acceleration for Deep Neural Networks. arXiv preprint arXiv:1710.09282.

Kanan, H. R., & Khanian, M. Y. A. (2012). Reduction of Neural Network Training Time Using an Adaptive Fuzzy Approach in Real Time Applications. International Journal of Information and Electronics Engineering, 2(3), 470.

Cheng, Y., Yu, F. X., Feris, R. S., Kumar, S., Choudhary, A., & Chang, S. F. (2015). An exploration of parameter redundancy in deep networks with circulant projections. In Proceedings of the IEEE International Conference on Computer Vision (pp. 2857-2865).

Han S. (2016). Compressing and regularizing deep neural networks. Retreived Mar. 22, 2018 from https://www.oreilly.com/ideas/compressing-and-regularizing-deep-neural-networks.

Figurnov, M., Ibraimova, A., Vetrov, D. P., & Kohli, P. (2016). PerforatedCNNs: Acceleration through elimination of redundant convolutions. In Advances in Neural Information Processing Systems (pp. 947-955).

Geist, et al., "Coverage-Directed Test Generation Using Symbolic Techniques," IBM Science and Technology, Haifa Research Lab, Haifa Israel, Computer Science • May 2002, 17 pages.

* cited by examiner

ANALYSIS OF VERIFICATION PARAMETERS FOR TRAINING REDUCTION

BACKGROUND

The present invention relates to coverage verification of computational logic, and more specifically, to reducing the size and complexity of verification test cases to reduce resource expenditures.

Completing coverage verification at the end of a project is a time intensive process and requires significant resources, including both human labor and compute resources. When designing complex computational logic, these verification procedures can be particularly intensive. For example, to verify the accuracy and adequacy of designed logic (e.g., a circuit, an algorithm, a program, and the like), the logic is often simulated, and this simulated logic is stimulated with a large number of test cases, each of which includes any number of parameters. This simulation process takes significant time and compute resources, particularly with growing project complexity. Further, the coverage of these tests can be difficult to manage, as tests are often duplicative in that they cause the logic to behave similarly or identically. Similarly, the tests often miss important coverage that should be tested. In order to ensure adequate coverage, therefore, many such test cases must be designed and simulated. This simulation process is extremely costly, time-consuming, and resource-intensive.

SUMMARY

According to one embodiment of the present disclosure, a method is provided. The method includes receiving a plurality of test results, wherein each of the plurality of test results specifies a respective one or more parameters and a respective one or more events, and determining a list of parameters used to stimulate computing logic. The method further includes generating a plurality of relevant parameters corresponding to parameters in the list of parameters that have at least two distinct values specified in the plurality of test results. Additionally, the method includes generating a plurality of training cases based on the plurality of test results and the plurality of relevant parameters. Finally, the method also includes generating a neural network for design verification of the computing logic based on the plurality of relevant parameters, and training the neural network based on the plurality of training cases.

According to a second embodiment of the present disclosure, a computer program product is provided. The computer program product includes a computer-readable storage medium having computer-readable program code embodied therewith, the computer-readable program code executable by one or more computer processors to perform an operation. The operation includes receiving a plurality of test results, wherein each of the plurality of test results specifies a respective one or more parameters and a respective one or more events, and determining a list of parameters used to stimulate computing logic. The operation further includes generating a plurality of relevant parameters corresponding to parameters in the list of parameters that have at least two distinct values specified in the plurality of test results. Additionally, the operation includes generating a plurality of training cases based on the plurality of test results and the plurality of relevant parameters. Finally, the operation also includes generating a neural network for design verification of the computing logic based on the plurality of relevant parameters, and training the neural network based on the plurality of training cases.

According to a third embodiment of the present disclosure, a system is provided. The system includes one or more computer processors, and a memory containing a program which when executed by the one or more computer processors performs an operation. The operation includes receiving a plurality of test results, wherein each of the plurality of test results specifies a respective one or more parameters and a respective one or more events, and determining a list of parameters used to stimulate computing logic. The operation further includes generating a plurality of relevant parameters corresponding to parameters in the list of parameters that have at least two distinct values specified in the plurality of test results. Additionally, the operation includes generating a plurality of training cases based on the plurality of test results and the plurality of relevant parameters. Finally, the operation also includes generating a neural network for design verification of the computing logic based on the plurality of relevant parameters, and training the neural network based on the plurality of training cases.

DETAILED DESCRIPTION

Figure 1:
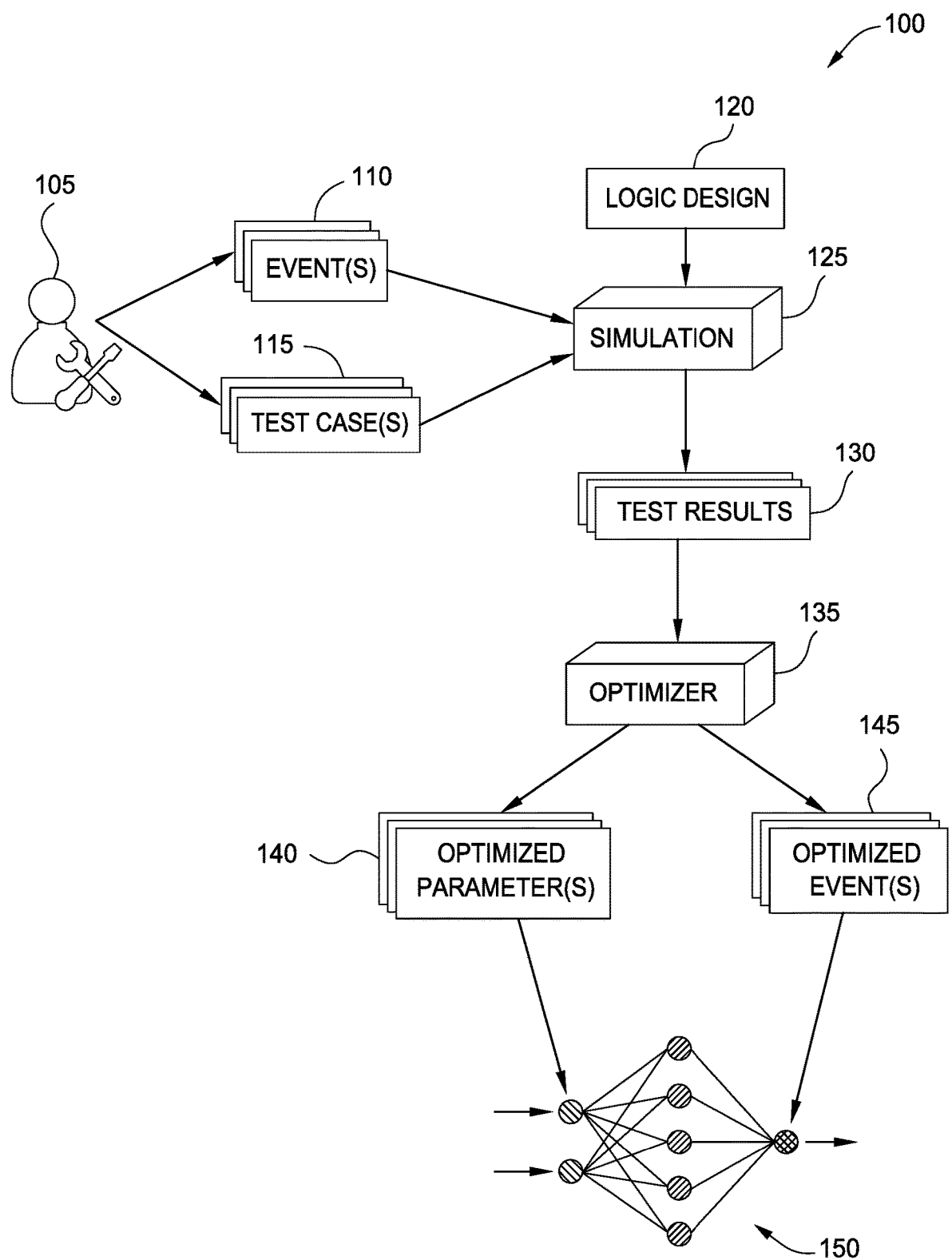
FIG. 1 illustrates workflow for optimization of a neural network for verification oriented applications, according to one embodiment disclosed herein.

Embodiments of the present disclosure enable the intelligent reduction of a testing data space in order to reduce the complexity of models used for verification of computational logic. In one embodiment, users (e.g., test engineers) perform functionality verification to determine the accuracy and efficiency of a logic design. In one embodiment, this verification is accomplished via test cases, which include one or more parameters to be used to stimulate the logic. For example, these parameters may include what data is provided, the timing or pacing of the data, and the like. In embodiments, these test case parameters can include any input to a logic design. In some embodiments, users design and define these test cases. In other embodiments, some of the test cases may be randomly generated (e.g., by randomly generating values for each defined parameter).

In embodiments, users also define events that they wish to monitor while the simulated logic is being stimulated. For example, these events may correspond to cache or buffer fullness or overflow, collisions, and the like. In embodiments, events can include any attribute or event occurring during stimulation of the computational logic, as well as any outputs of the logic. In some embodiments, a design under test is first stimulated using automatically generated (e.g., random) test cases. Once the coverage provided by these tests is determined (e.g., the events that are triggered by each test case), in some embodiments, users may manually design additional test cases in an attempt to expand the test coverage to confirm the adequacy of the logic.

Embodiments of the present disclosure enable more efficient testing of computational logic. As used herein, computational logic may include circuit design, integrated circuitry, software logic, and the like. In one embodiment, the logic under test is stimulated based on the parameters included in each test case, and it is determined, for each defined event, whether the event occurred. In some embodiments, determining whether an event occurred further comprises determining a value for the event (e.g., how many times it occurred, how frequently it occurred, how quickly the event transpired, how full or empty an entity such as a buffer is at various points in the simulation, and the like).

In one embodiment, a test result is generated for each simulated test case. In an embodiment, test cases are executed on the fully simulated (or actually constructed) computational logic design. In one embodiment, each test result includes an indication as to which event(s) were triggered by the corresponding test case (as well as, in some cases, one or more values for each event). In some embodiments, each test result refers to the test case, as well as the corresponding covered events. That is, in an embodiment, each test result includes an indication as to the corresponding parameters that were used during the test (e.g., as defined by the corresponding test case), as well as the event(s) that were triggered. In some embodiments, when a test case triggers a coverage event, that event is said to be "hit" or "covered" by the test case or test. As discussed above, this full simulation of test cases can take significant resources and time to complete, which severely limits the number of such test cases that can be fully simulated and requires significant resource dedication. Further, as design changes are made, older tests must be re-run again, further adding to the already lengthy and computationally-expensive verification process. Additionally, it is difficult to craft test cases to cover a specific event, as the interactions of the logic can be difficult to predict, and trying out test cases takes significant time and resources.

Embodiments of the present disclosure provide for the use of one or more artificial neural networks (NN) to improve coverage verification, as well as design of test cases. In one embodiment, the test results (which include both the input parameters and the resulting events) are used to train a machine learning model, such as an NN. In such an embodiment, the test parameters are utilized as input to the NN, and the resulting events are used as the target output. Generally, the size and complexity of the NN is defined based on a variety of factors, including the number of parameters that are utilized across all test cases, as well as the number of events that are monitored. For example, in embodiments, the parameters for a particular test case are provided as input in the form of a vector, where each value or dimension in the vector corresponds to a particular parameter. In embodiments, if a test case does not define a parameter that a different test case does include, this dimension is padded with a zero or null character.

Thus, in embodiments, the size of the input layer of the NN (e.g., the number of neurons in the input layer) is defined based on the number of distinct parameters that are used to simulate the logic, as reflected across all test cases. Similarly, in an embodiment, the size of the output layer (e.g., the number of neurons in the output layer) of the NN is defined based on the number of events that are monitored during simulation, as reflected in the test cases. For example, suppose a first test case defines variables or parameters A, B, and C, and indicates that events 1 and 2 occurred. Suppose further that a second test case defines parameters A, C, and D, and indicates that events 2, 3, and 4 were triggered. In such an embodiment, the NN requires four neurons in the input layer (one each for parameters A, B, C, and D), as well as four neurons in the output layer (one each for event 1, 2, 3, and 4).

In embodiments, the time complexity of training the NN increases non-linearly. In one embodiment, the complexity of training the NN is defined by $O(n*m*h^{k}*o*i)$, where n is the number of test cases (e.g., samples), m is the number of parameters (e.g., inputs), h is the number of hidden layers, k is the number of nodes in each hidden layer, o is the number of events (e.g., outputs), and i is the number of training iterations. Thus, by intelligently reducing the number of parameters (inputs) and/or the number of events (outputs), embodiments of the present disclosure enable significant reduction of the size and complexity of the NN. This reduces the time and computational resources required for training and using the NN, while improving verification by enabling engineers to focus on the particularly interesting or relevant test cases and events.

FIG. 1 illustrates workflow 100 for optimization of a neural network for verification oriented applications, according to one embodiment disclosed herein. In the illustrated embodiment, Users 105 (such as test engineers) design and define Event(s) 110 that they wish to monitor, as well as Test Cases(s) 115 that they wish to execute. As discussed above, in some embodiments, one or more of the Test Cases 115 are defined automatically (e.g., through random generation of parameters). In some embodiments, the parameters themselves are defined based in part on the Logic Design 120 to be tested (e.g., based on the inputs that the Logic Design 120 receives). In some embodiments, Users 105 may also define additional parameters that are not defined by the Logic Design 120 itself (such as pacing of data, traffic, and the like). Further, in one embodiment, Users 105 can define one or more parameters as "default," indicating that they have a fixed value that does not change between Test Cases 115, or "non-default," indicating that the value of the parameter can change between Test Cases 115.

As depicted in the illustrated workflow 100, the Logic Design 120 is used to generate a Simulation 125. As discussed above, in embodiments, the Logic Design 120 generally refers to computational logic, and may include hardware logic, software logic, as well as combinations of both hardware and software. As discussed above, in embodiments, the Simulation 125 involves fully and accurately simulating the entirety of the Logic Design 120, such that the Simulation 125 performs just as the Logic Design 120 would perform, were it to be fully fabricated. This Simulation 125 is therefore often an intensive process, requiring significant computing resources for each test.

In the illustrated embodiment, the defined Events 110 and Test Cases 115 are provided to the Simulation 125. That is, as illustrated, via the Simulation 125, the Logic Design 120 is stimulated based on the Test Cases 115 (e.g., based on the parameters and values defined in each Test Case 115), and the defined Events 110 are monitored to detect hits or coverage. As illustrated in the workflow 100, these simulations result in a Test Result 130 for each Test Case 115. As discussed above, in an embodiment, each Test Result 130 includes an indication as to the parameters defined by the corresponding Test Case 115 (e.g., which parameters were included, as well as the value(s) for each parameter), as well as the Events 110 that were hit or triggered (as well as, in some embodiments, one or more value(s) for one or more of the Events 110).

In the illustrated embodiment, these Test Results 130 are provided to an Optimizer 135, which processes the Test Results 130 to generate Optimized Parameters 140 and Optimized Events 145, as discussed below in more detail. In an embodiment, the Optimizer 135 reduces the number of parameters by identifying particularly important or relevant parameters, which make up the Optimized Parameters 140. Further, in an embodiment, the Optimizer 135 reduces the total number of Events 110 by identifying particularly relevant or important Events 110, as discussed below in more detail, to generate the Optimized Events 145.

As depicted in the illustrated workflow 100, the Optimized Parameters 140 are used to define the input layer of a NN 150. For example, in one embodiment, a neuron in the input layer is created for each parameter in the Optimized Parameters 140. Although two input neurons are illustrated, in embodiments, any number of input neurons can be utilized (for any number of Optimized Parameters 140). Similarly, as illustrated, the Optimized Events 145 are used to define the output layer of the NN 150. For example, in one embodiment, a neuron in the output layer is created for each event in the Optimized Events 145. Although one output neuron is illustrated, in embodiments, any number of output neurons can be utilized (for any number of Optimized Events 145). In this way, the size of the NN 150 is reduced, which can significantly improve the time and computational intensity of training and using the model.

In an embodiment, in order to train the generated NN 150, training cases are generated. In one embodiment, for each Test Result 130, a training case is generated. In some embodiments, the input for each training case is determined based on the value(s) for each parameter specified in the corresponding Test Case 115. In one embodiment, the system determines, for each of the Optimized Parameters 140, what the value is for the respective parameter in the respective training case. In an embodiment, all other parameters (e.g., those not included in the Optimized Parameters 140) are discarded. Similarly, to generate the target output for each training case, the Events 110 included in the corresponding Test Result 130 are parsed to identify and extract values for each event specified in the Optimized Events 145. In an embodiment, all other events (e.g., those not designated in the Optimized Events 145) are discarded.

In this way, the NN 150 can be trained and refined much more rapidly, and with reduced computational footprint, which enables the Users 105 to more rapidly iterate on their designs and tests. Further, by utilizing the NN 150 rather than a full Simulation 125 for designing of test cases, the Users 105 can more rapidly identify important or interesting test cases, rather than waste time and resources fully simulating test cases which are duplicative or unnecessary. In some embodiments, these results can be used to design test cases for full Simulation 125, as well as to modify or refine the Logic Design 120 itself, in a rapid and iterative manner.

Figure 2:
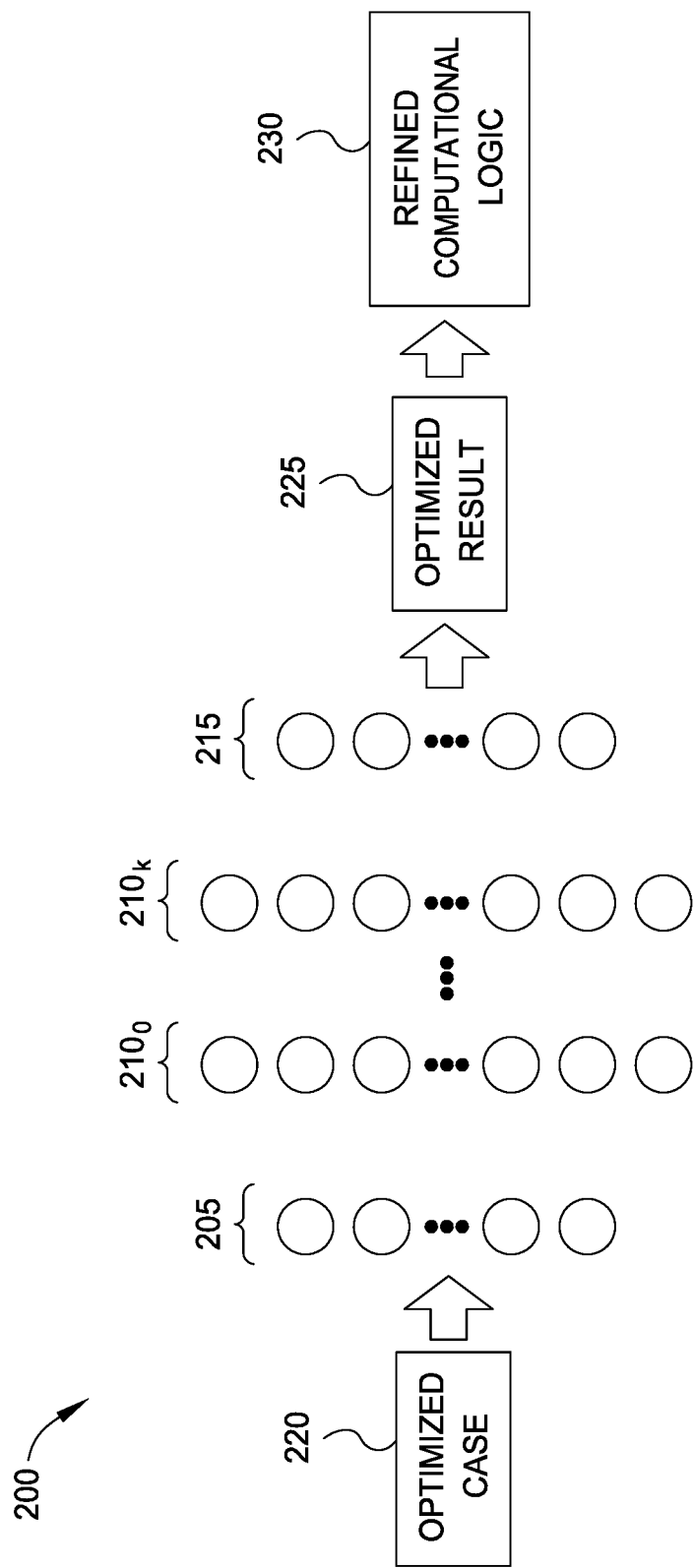
FIG. 2 illustrates workflow for utilizing an optimized neural network for coverage verification and computational logic refinement, according to one embodiment disclosed herein.

FIG. 2 illustrates workflow 200 for utilizing an optimized neural network for coverage verification and computational logic refinement, according to one embodiment disclosed herein. In the illustrated embodiment, Optimized Cases 220 are provided to an optimized NN, in order to generate Optimized Results 210. In one embodiment, the Optimized Cases 220 are designed by Users 105, in a similar manner to Test Cases 115. Similarly, in some embodiments, Optimized Cases 220 can be automatically generated. In the illustrated embodiment, the Optimized Cases 220 differ from ordinary Test Cases 115 in that they specify a reduced set of parameters. For example, in an embodiment, the Optimized Cases 220 can only include the Optimized Parameters 140 (although each Optimized Case 220 need not include a value for every Optimized Parameter 140). In this way, the complexity and size of the NN is reduced, improving efficiency and computational use. In an embodiment, the Optimized Cases 220 are provided to the Input Layer 205 using a vector. For example, in one embodiment, the Optimized Cases 220 are M-dimensional vectors, where M corresponds to the number of Optimized Parameters 140 (and thus the number of neurons in the Input Layer 205). In such an embodiment, each dimension in the input vector corresponds to a value for the respective parameter in the Optimized Case 220.

In the illustrated embodiment, the neural network includes an Input Layer 205, an Output Layer 215, and any number of middle or Hidden Layers 210. As illustrated by the ellipses in the Input Layer 205, the Input Layer 205 can include any number of neurons. In one embodiment, the Input Layer 205 includes a neuron for each Optimized Parameter 140. Similarly, as illustrated by the ellipses in the Output Layer 215, the Output Layer 215 can also include any number of neurons. In one embodiment, the Output Layer 215 includes a neuron for each identified Optimized Event 145. Further, as illustrated, there may be any number of Hidden Layers $210_0$-$210_k$. Additionally, each Hidden Layer 210 may include any number of neurons, depending on the particular implementation. For simplicity, the connections between each neuron in the NN are not illustrated. In embodiments, however, the layers and neurons of the NN may be connected using any number of connections. In embodiments, one or more layers may be fully connected, while others may be non-fully connected, depending on the particular implementation.

As illustrated, the NN generates Optimized Results 210. In an embodiment, each Optimized Result 225 is an O-dimensional vector, where O corresponds to the number of neurons in the Output Layer 215 (and thus, the number of Optimized Events 145). In one embodiment, each dimension in the Optimized Result 225 corresponds to a particular Optimized Event 145, and the value of the dimension indicates the likelihood or probability that the Optimized Case 220 would hit, cover, or trigger the particular event, if the Optimized Case 220 were to be simulated (e.g., via a full and complete Simulation 125). In some embodiments, this information is provided to the User 105. In some embodiments, each value is compared to one or more predefined thresholds, in order to generate binary results (e.g., a 1 or a 0, a "yes" or a "no," a "hit" or a "miss," and the like). In embodiments, the User 105 may quickly determine whether to fully simulate the Optimized Case 220, based on which Events 110 are likely to be hit by the Optimized Case 220, as well as which Events 110 are likely to be missed.

Based on these Optimized Results 225, in an embodiment, the User 105 can design additional Optimized Cases 220 for further evaluation. Similarly, in embodiments, the User 105 can develop additional Test Cases 115 for full Simulation 125. Because embodiments of the present disclosure provide for a NN with reduced complexity and size, the Users 105 can more rapidly generate and run new tests, in order to obtain full coverage of the design under test. In embodiments, the "coverage" of a Logic Design 120 refers to the number or percentage of Events 110 that have been hit or triggered by the various Test Cases 115. As coverage improves, Users 105 can be more confident that the Logic Design 120 is sound.

In the illustrated embodiment, based on the Optimized Results 225, Users 105 can refine the Logic Design 120, resulting in Refined Computational Logic 230. For example, by utilizing the optimized NN, a User 105 may identify a new set of parameters (e.g., a new Test Case 115) that triggers one or more Events 110 which have not been previously hit (or have been sparsely or rarely hit). Based on these events, the User 105 may refine, modify, or adjust the Logic Design 120. Advantageously, this process can occur iteratively and rapidly, without the need for expensive and slow Simulation 125 for each and every test. This allows the Refined Computational Logic 230 to reach full maturity much more quickly, with fewer expenditures in terms of human effort, time, money, and computational resources.

In embodiments of the present disclosure, therefore, logical designs (e.g., circuit designs) can be probed with improved test cases, by using the optimized NN to determine which tests are likely to be the most useful. This allows more rapid refinement of the logic, until a final verified or validated design is created. Once the logic design has been thusly verified, the logic may be put into operation, such as by fabrication of an integrated circuit, based on the computational logic. Advantageously, using embodiments of the present disclosure, the final product can be created more rapidly, and with reduced resource consumption. Further, the final computational logic may be improved by the better test cases, which aid Users 105 in achieving full coverage of the tests. This helps to ensure that the logic is accurate, efficient, and without faults.

In one embodiment, a separate NN is trained for each Logic Design 120 under test. In some embodiments, when a fully simulated Test Case 115 hits an Event 110 that had not previously been triggered, the NN may be refined or retrained to include this Test Case 115 and Event 110. Similarly, in some embodiments, when an Event 110 is being hit or more less frequently than before (e.g., as compared to the Test Cases 115 that were used to train the NN), the NN may be refined or retrained based on these more recent tests and events. In one embodiment, each time the Logic Design 120 is refined or modified, an entirely new NN is generated and trained. In some embodiments, rather than re-generating a new NN, the existing NN is modified, retrained, or refined.

Figure 3:
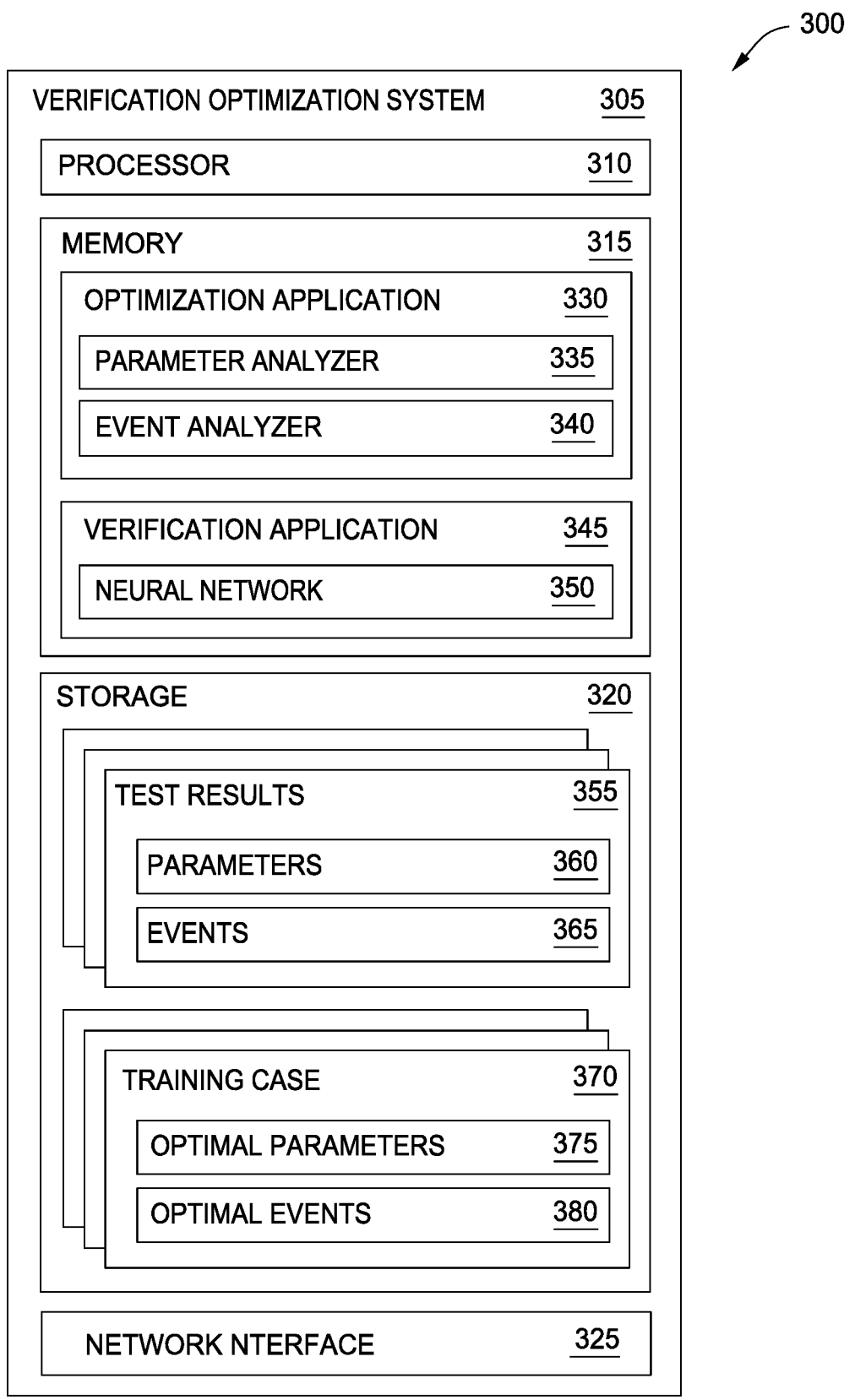
FIG. 3 is a block diagram illustrating a verification optimization system, according to one embodiment disclosed herein.

FIG. 3 is a block diagram illustrating a Verification Optimization System 305, according to one embodiment disclosed herein. As illustrated, the Verification Optimization System 305 includes a Processor 310, a Memory 315, Storage 320, and a Network Interface 325. In the illustrated embodiment, Processor 310 retrieves and executes programming instructions stored in Memory 315 as well as stores and retrieves application data residing in Storage 320. Processor 310 is representative of a single CPU, multiple CPUs, a single CPU having multiple processing cores, and the like. Memory 315 is generally included to be representative of a random access memory. Storage 320 may be a disk drive or flash-based storage device, and may include fixed and/or removable storage devices, such as fixed disk drives, removable memory cards, or optical storage, network attached storage (NAS), or storage area-network (SAN). Through the Network Interface 325, the Verification Optimization System 305 may be communicatively coupled with other devices, including data stores, Simulations 125, terminals or devices used by Users 105, and the like.

Although illustrated as a single device, in embodiments, the Verification Optimization System 305 may operate on a physical device, or as a virtual machine. Similarly, in embodiments, the functionality of the Verification Optimization System 305 may be collected or distributed across any number of devices or logical partitions, in various embodiments. In the illustrated embodiment, the Storage 320 includes a number of Test Results 355, each of which specify a set of Parameters 360 and Events 365. In one embodiment, the Test Results 355 correspond to test runs that have been completed by a Simulation 125 which fully simulates a Logic Design 120. In such an embodiment, the Parameters 360 correspond to the parameters used to stimulate the Logic Design 120 during the test, and the Events 365 correspond to the events which were hit or triggered during the test. Although illustrated as residing in Storage 320, in embodiments, the Test Results 355 may reside in any suitable location, including on one or more other devices, in the cloud, and the like.

As illustrated, the Storage 320 also includes a number of Training Cases 370. The Training Cases 370 each include a set of Optimal Parameters 375 and Optimal Events 380. In an embodiment, once a reduced set of parameters and events are generated for a particular Logic Design 120 (e.g., Optimized Parameters 140 and Optimized Events 145), the Verification Optimization System 305 generates a set of Training Cases 370 based on the Test Results 355, as discussed in more detail below. Although illustrated as residing in Storage 320, in embodiments, the Training Cases 370 may reside in any suitable location, including on one or more other devices, in the cloud, and the like.

In the illustrated embodiment, the Memory 315 includes an Optimization Application 330 and a Verification Application 345. Although illustrated as separate applications, in embodiments, the functionality of the Optimization Application 330 and Verification Application 345 may be combined into a single application. The Optimization Application 330 includes a Parameter Analyzer 335 and an Event Analyzer 340, which analyze and optimize parameters and events, respectively. Although illustrated as distinct components, in embodiments, the Parameter Analyzer 335 and Event Analyzer 340 may have their functionality combined or distributed across any other components. Further, in embodiments, the functionality of the Optimization Application 330 may be achieved through software, hardware, or a combination of both software and hardware.

In an embodiment, the Parameter Analyzer 335 parses the Test Results 355 to determine all of the possible Parameters 360 that are used to stimulate the Logic Design 120. In some embodiments, the list of possible parameters are provided to the Parameter Analyzer 335, such as by a User 105. Once this list of possible parameters is determined, the Parameter Analyzer 335 analyzes each parameter to determine, for each parameter, whether predefined criteria are satisfied. In an embodiment, this criteria is related to how interesting or relevant the parameter is, in terms of achieving satisfactory coverage with a reduced data space. In one embodiment, the criteria relate to the variety of the parameter (e.g., how much the value differs between Test Results 355), as discussed in more detail below.

In one embodiment, the Event Analyzer 340 similarly parses Test Results 355 to determine all of the Events 365 that have been hit by the Test Results 355. In some embodiments, this list of events also includes Events 110 which have been defined, but not yet hit by any test. In one embodiment, the list of possible Events 110 are similarly provided by a User 105. The Event Analyzer 340 then compares each possible event with predefined criteria related to the relevancy or interestingness of the event. For example, in one embodiment, the criteria is related to how many times the event has been triggered, how often it is triggered, how recently it was triggered, and the like, as discussed in more detail below. Thus, as illustrated, based on the Test Results 355, the Optimization Application 330 determines a subset of the parameters and events that satisfy predefined criteria, in order to reduce the complexity and size of the coverage verification models (e.g., one or more NNs).

In the illustrated embodiment, the Verification Application 345 includes a Neural Network 350. In embodiments, the Verification Application 345 may include any number of NNs 350. As discussed above, in embodiments, the Verification Application 345 generates the NN 350 based on the optimizations generated by the Optimization Application 330. Further, in one embodiment, the Verification Application 345 generates the Training Cases 370 by paring down the Test Results 355 based on the determined optimal or relevant Parameters 360 and Events 365. In an embodiment, the Verification Application 345 further trains and refines the NN 350 based on these Training Cases 370. After training, the NN 350 can be utilized with a reduced set of parameters and outputs, which reduces complexity, time, and computational resources needed to evaluate the value of new test cases. For example, a User 105 can evaluate whether a new test case will add value to the coverage testing based on whether it is likely to trigger interesting events, add additional coverage, avoid duplicate coverage, and the like.

Figure 4:
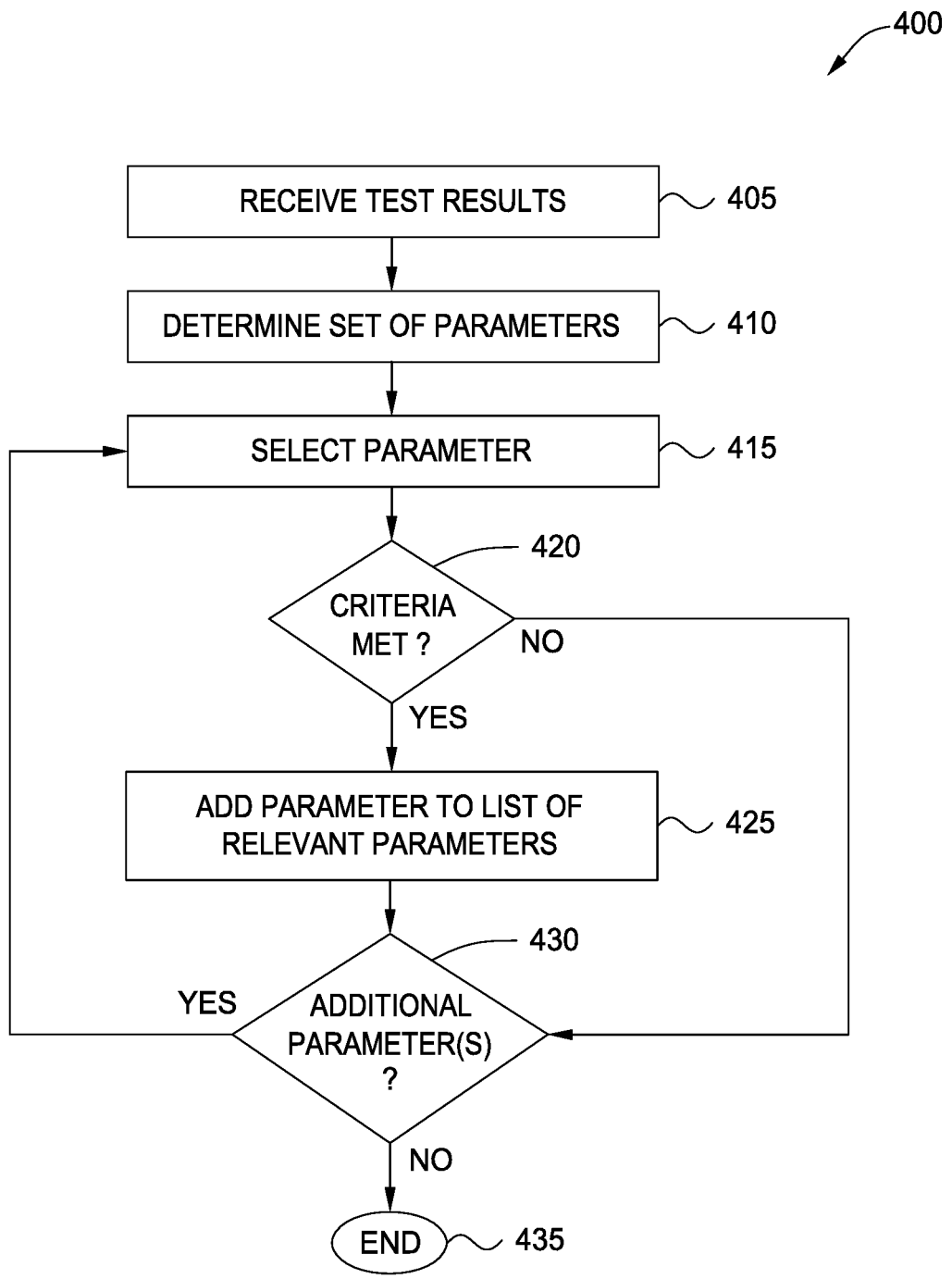
FIG. 4 is a flow diagram illustrating a method of optimizing verification test case parameters, according to one embodiment disclosed herein.

FIG. 4 is a flow diagram illustrating a method 400 of optimizing verification test case parameters, according to one embodiment disclosed herein. In the illustrated embodiment, the method 400 begins at block 405, where the Optimization Application 330 receives one or more test results. In an embodiment, each test result corresponds to a test case that was fully used to stimulate a fully simulated (or fully fabricated) computational logic design. In one embodiment, each test result includes a set of parameters and values for each parameter used by the test case, as well as a set of events that were triggered during the simulation or execution of the test case. In some embodiments, each test result includes a list of all possible parameters for the design. In such an embodiment, the test result may indicate which parameters were provided a particular value (along with what the value was) as well as which parameters were not modified or changed (e.g., as indicated by a 0, a null value, or some other value that serves as the "default" value for the particular parameter).

Similarly, in some embodiments, each test result may include all of the defined events (rather than only the hit or covered events), along with an indication as to which events were triggered. In some embodiments, each test result further includes one or more values for one or more of the events (e.g., how many times it was hit during the test, when it was hit, the frequency of the hits, a size, capacity, delay, or any other value associated with the event). The method 400 then proceeds to block 410, where the Parameter Analyzer 335 determines a total set of parameters based on the test results. For example, in an embodiment, the Parameter Analyzer 335 determines every parameter that has been used to stimulate the logic, based on the parameters specified in each of the test results. In some embodiments, this master list of parameters is provided by a User 105.

The method 400 continues to block 415, where the Parameter Analyzer 335 selects a parameter from the determined list of all possible parameters. At block 420, the Parameter Analyzer 335 determines whether one or more predefined criteria are satisfied by the selected parameter. In embodiments, the evaluated criteria may vary depending on the particular computational logic that is being tested. In some embodiments, Users 105 can define the criteria. In one embodiment, the criteria is based at least in part on the diversity of each respective parameter, in terms of how much it changes from one test to the next. In some embodiments, the Users 105 can further define or select particular parameters to be included, regardless of the criteria.

If, at block 420, the Parameter Analyzer 335 determines that the selected parameter satisfies the criteria, the method 400 proceeds to block 425. At block 425, the Parameter Analyzer 335 adds the selected parameter to a list or set of relevant or interesting parameters. Thus, in embodiments, the set of relevant parameters is a subset of the entire set of possible parameters. The method 400 then continues to block 430. Additionally, if the Parameter Analyzer 335 determines that the criteria is not satisfied, the method 400 skips block 425 and proceeds to block 430. At block 430, the Parameter Analyzer 335 determines whether there are additional parameters to be evaluated. If so, the method 400 returns to block 415 to select the next parameter in the set. Otherwise, the Parameter Analyzer 335 finalizes the set of relevant or interesting parameters, and the method 400 terminates at block 435.

Figure 5:
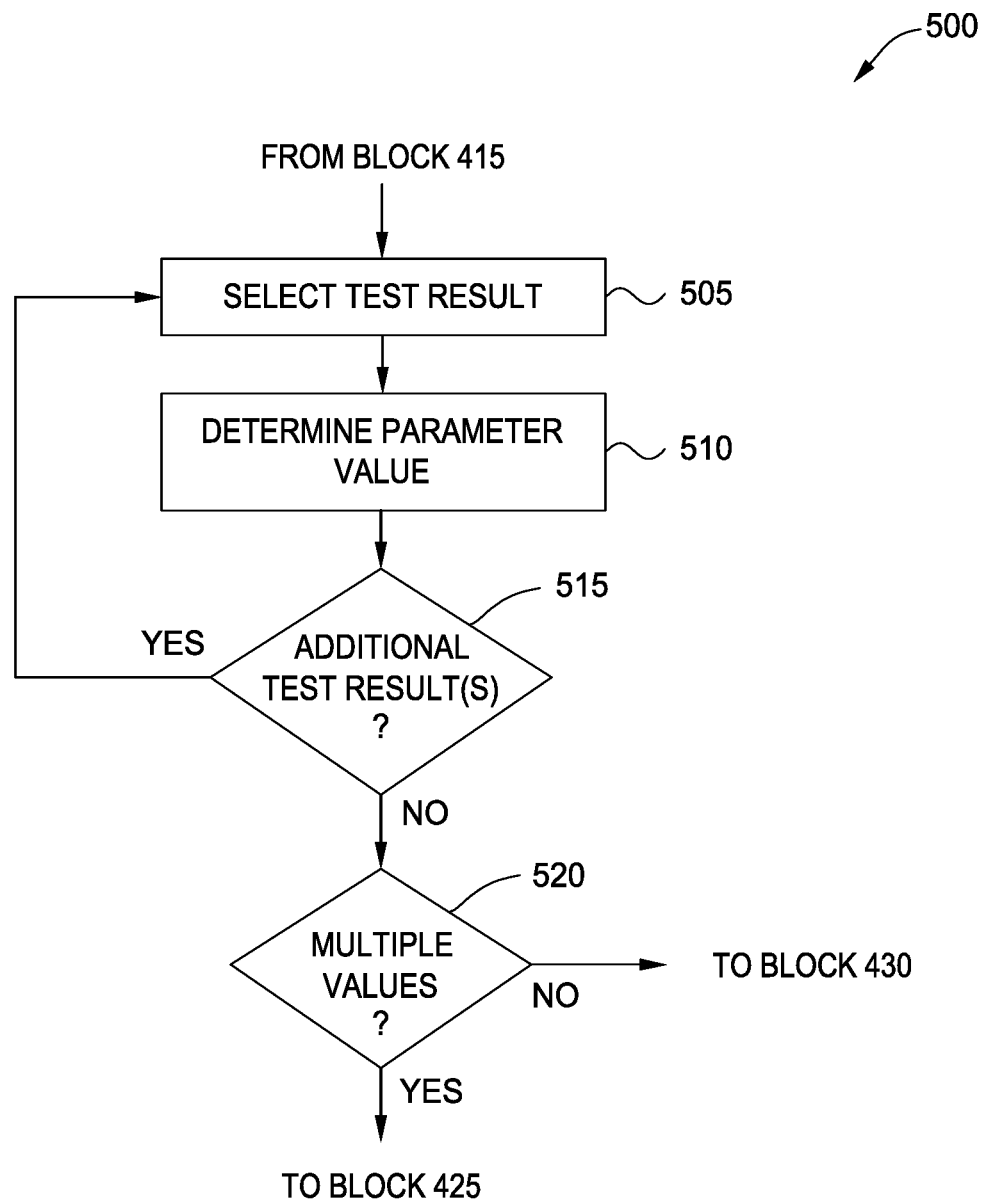
FIG. 5 is a flow diagram illustrating a method of identifying optimal or relevant parameters for coverage verification, according to one embodiment disclosed herein.

FIG. 5 is a flow diagram illustrating a method 500 of identifying optimal or relevant parameters for coverage verification, according to one embodiment disclosed herein. In an embodiment, the method 500 may replace block 420 of FIG. 4, and provides additional detail for the criteria evaluation step. The method 500 begins from block 415 of FIG. 4. At block 505, the Parameter Analyzer 335 selects a first test result in the received test results. The method 500 then proceeds to block 510, where the Parameter Analyzer 335 determines the value of the current selected parameter, as indicated in the selected test result. In one embodiment, the Parameter Analyzer 335 may first determine whether the test result includes the selected parameter at all. If not, the Parameter Analyzer 335 concludes that a default value was used for the parameter.

Once the value of the selected parameter, with respect to the selected test result, is determined, the method 500 continues to block 515, where the Parameter Analyzer 335 determines whether there are additional test results to be considered. If so, the method 500 returns to block 505 to select the next test result. If not, the Parameter Analyzer 335 has determined the respective value of the selected parameter with for each respective test result. The method 500 continues to block 520, where the Parameter Analyzer 335 determines whether there are multiple values specified. That is, in the illustrated embodiment, the Parameter Analyzer 335 determines whether the selected parameter has at least two different values across all of the test results, or whether it has the same value for all tests. If multiple values are identified, the criteria provided by method 500 is satisfied, and the method 500 returns to block 425 of FIG. 4. Otherwise, the method 500 proceeds to block 430 of FIG. 4.

In the illustrated embodiment, the criteria relates to whether the parameter is a default parameter that does not change, or is a dynamic parameter that differs between test results. In some embodiments, the criteria may include determining an amount of change for each parameter. For example, in one embodiment, the Parameter Analyzer 335 determines whether the values specified for the parameter in each test differ more than a predefined amount or percentage. In a related embodiment, the Parameter Analyzer 335 determines how many different values are provided, and compares this number to a predefined number in order to determine whether the parameter is sufficiently interesting or relevant to be included in the Optimized Parameters 140. In embodiments, the criteria utilized can vary based on the particular design needs, as well as based on input from the Users 105.

Figure 6:
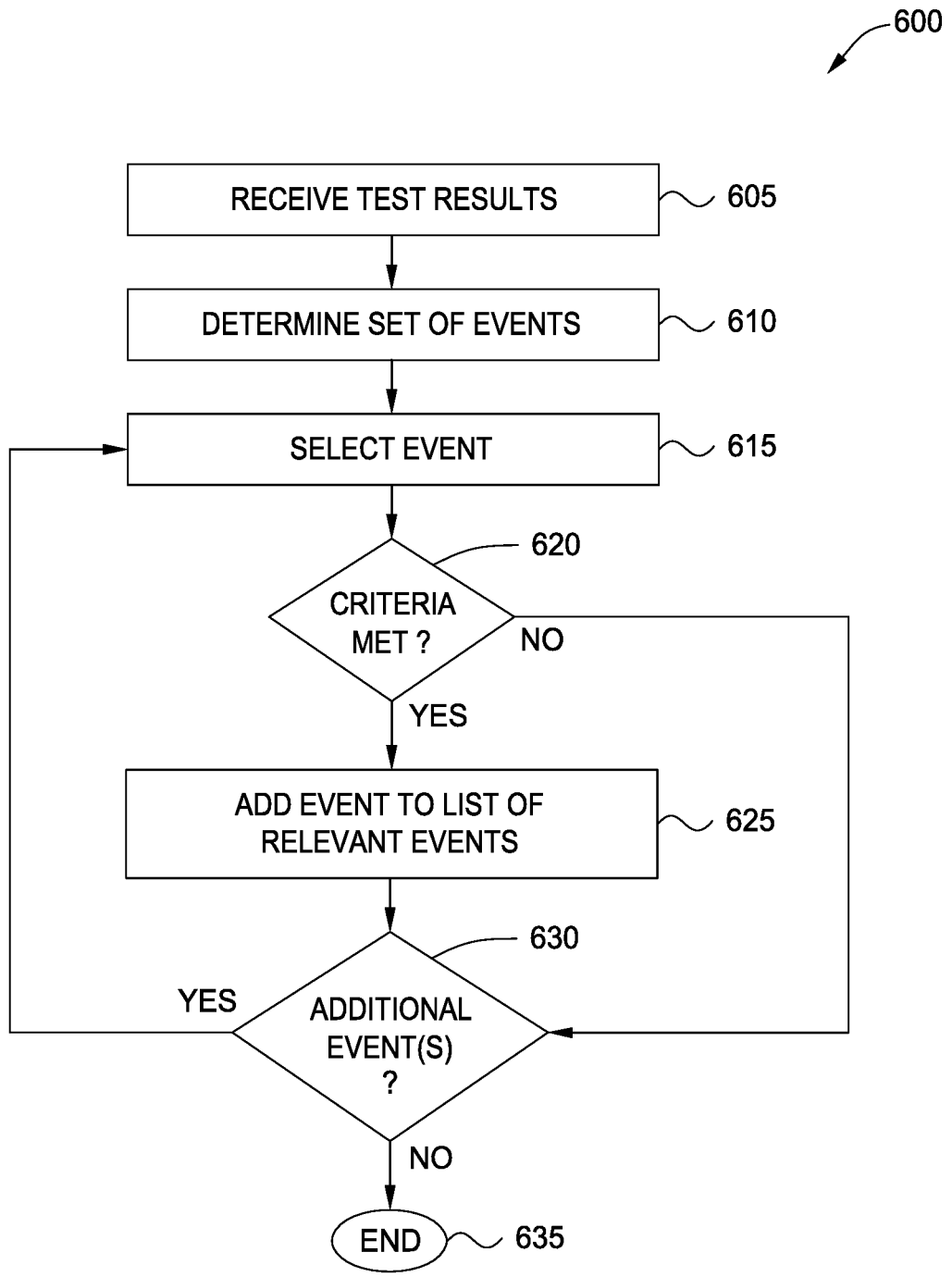
FIG. 6 is a flow diagram illustrating a method of optimizing verification test case events, according to one embodiment disclosed herein.

FIG. 6 is a flow diagram illustrating a method 600 of optimizing verification test case events, according to one embodiment disclosed herein. The illustrated method 600 begins at block 605, where the Optimization Application 330 receives a set of test results. In an embodiment, as discussed above, each test result corresponds to a test case that was fully used to stimulate a fully simulated (or fully fabricated) computational logic design. In one embodiment, each test result includes a set of parameters, as well as values for each parameter, used by the test case, as well as a set of events that were triggered during the simulation or execution of the test case.

The method 600 then proceeds to block 610, where the Event Analyzer 340 determines the set of possible events, as indicated in the test results. In one embodiment, rather than evaluating the test results, the Event Analyzer 340 receives the design specifications for the Simulation 125, which specifies all of the possible Events 110. Once the Event Analyzer 340 has determined the set of possible events, the method 600 proceeds to block 615, where the Event Analyzer 340 selects an event from the determined list. At block 620, the Event Analyzer 340 determines whether predefined criteria are met. In embodiments, the evaluated criteria may vary depending on the particular computational logic that is being tested. In some embodiments, Users 105 can define the criteria. In one embodiment, the criteria is based at least in part on the frequency with which each event is triggered, the recentness of the event being triggered, and the like. In some embodiments, the Users 105 can further define or select particular events to be included, regardless of the criteria.

If, at block 620, the Event Analyzer 340 determines that the selected event satisfies the criteria, the method 600 proceeds to block 625. At block 625, the Event Analyzer 340 adds the selected event to a list or set of relevant or interesting events. Thus, in embodiments, the set of relevant events is a subset of the entire set of possible events. The method 600 then continues to block 630. Additionally, if the Event Analyzer 340 determines that the criteria is not satisfied, the method 600 skips block 625 and proceeds to block 630. At block 630, the Event Analyzer 340 determines whether there are additional events to be evaluated. If so, the method 600 returns to block 615 to select the next event in the set. Otherwise, the Event Analyzer 340 finalizes the set of relevant or interesting events, and the method 600 terminates at block 635.

Figure 7:
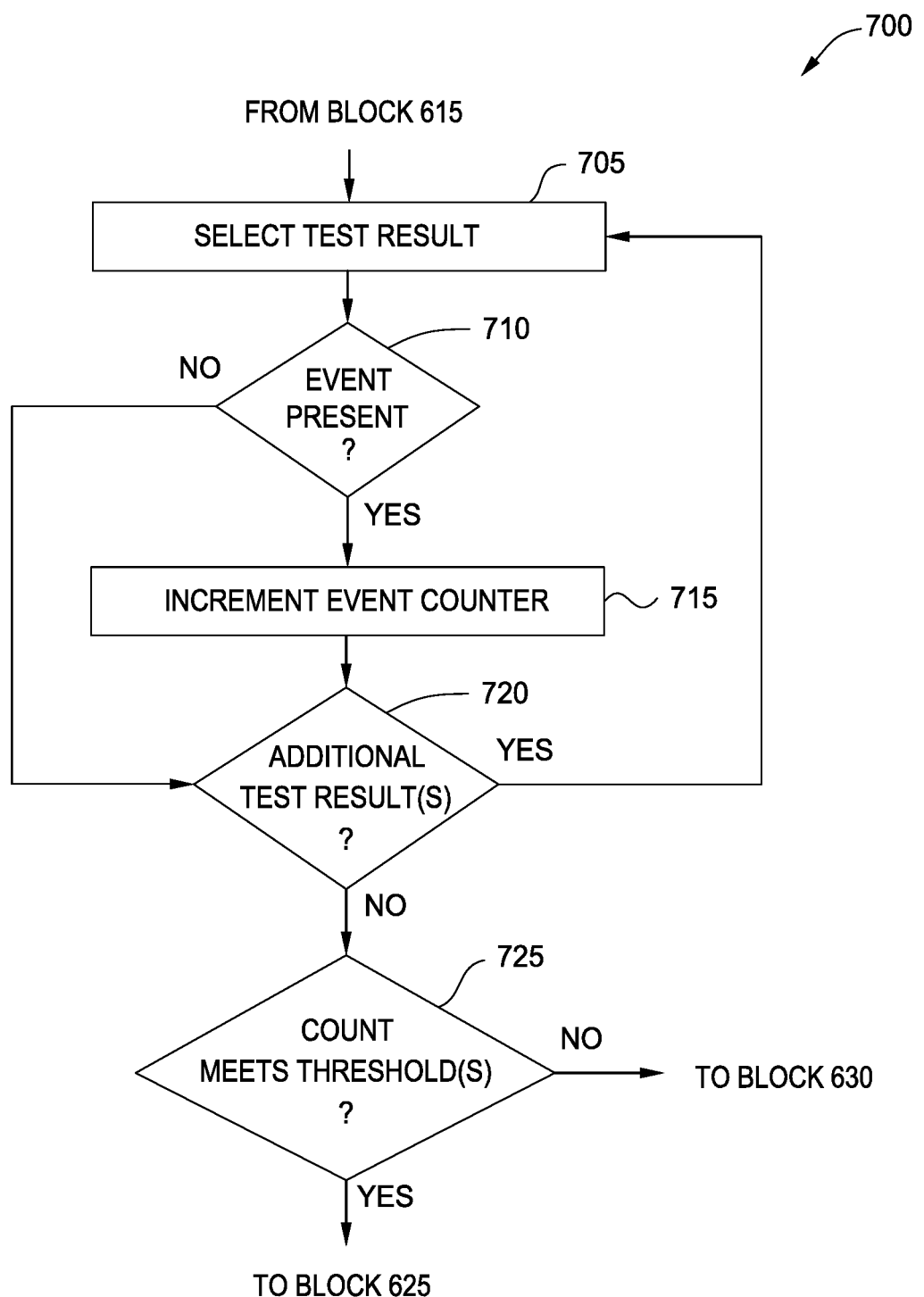
FIG. 7 is a flow diagram illustrating a method of identifying optimal or relevant events for coverage verification, according to one embodiment disclosed herein.

FIG. 7 is a flow diagram illustrating a method 700 of identifying optimal or relevant events for coverage verification, according to one embodiment disclosed herein. In an embodiment, the method 700 may replace block 620 of FIG. 6, and provides additional detail for the criteria evaluation step. The method 700 begins from block 615 of FIG. 6. At block 705, the Event Analyzer 340 selects a first test result in the received test results. The method 700 then proceeds to block 710, where the Event Analyzer 340 determines whether the selected event is present in the selected test result. That is, the Event Analyzer 340 determines whether the selected event was hit, triggered, or covered by the test result. If so, the method 700 proceeds to block 715, where the Event Analyzer 340 increments an event counter for the selected event. The method 700 then proceeds to block 720. Additionally, if the event was not hit by the selected test result, the method 700 proceeds to block 720.

At block 720, the Event Analyzer 340 determines whether there are additional test results to be considered with respect to the selected event. If so, the method 700 returns to block 705 to select the next test result. Otherwise, the method 700 proceeds to block 725. At block 725, the Event Analyzer 340 compares the event counter to one or more predefined thresholds. For example, in one embodiment, a first threshold may be used to verify that the event has occurred at least a predefined number of times (e.g., at least once) before it is included as a relevant or interesting event. Similarly, in an embodiment, a second threshold may be used to determine whether the selected event is sufficiently rare, in that it occurs infrequently enough to be interesting or relevant (e.g., the count is below a defined threshold).

If the threshold(s) are satisfied, the method 700 proceeds to block 625 of FIG. 6. Otherwise, the method 700 continues to block 630 of FIG. 6. In the illustrated embodiment, the criteria relates to whether the event has occurred at least a minimum number of times, and/or fewer than a maximum number of times. This allows the identification of rare events in the data. In some embodiments, the criteria may include a determination as to whether the event occurs sufficiently frequently compared to the other events, as opposed to only considering the absolute number of occurrences. For example, in one embodiment, the Event Analyzer 340 may determine occurrence counts for each event, and rank the events based on their respective occurrence data. In such an embodiment, the Event Analyzer 340 may determine that events that occur in fewer than a predefined percentage of test results (e.g., in fewer than 10% of test cases) satisfy the criteria. In embodiments, the criteria utilized can vary based on the particular design needs, as well as based on input from the Users 105.

Figure 8:
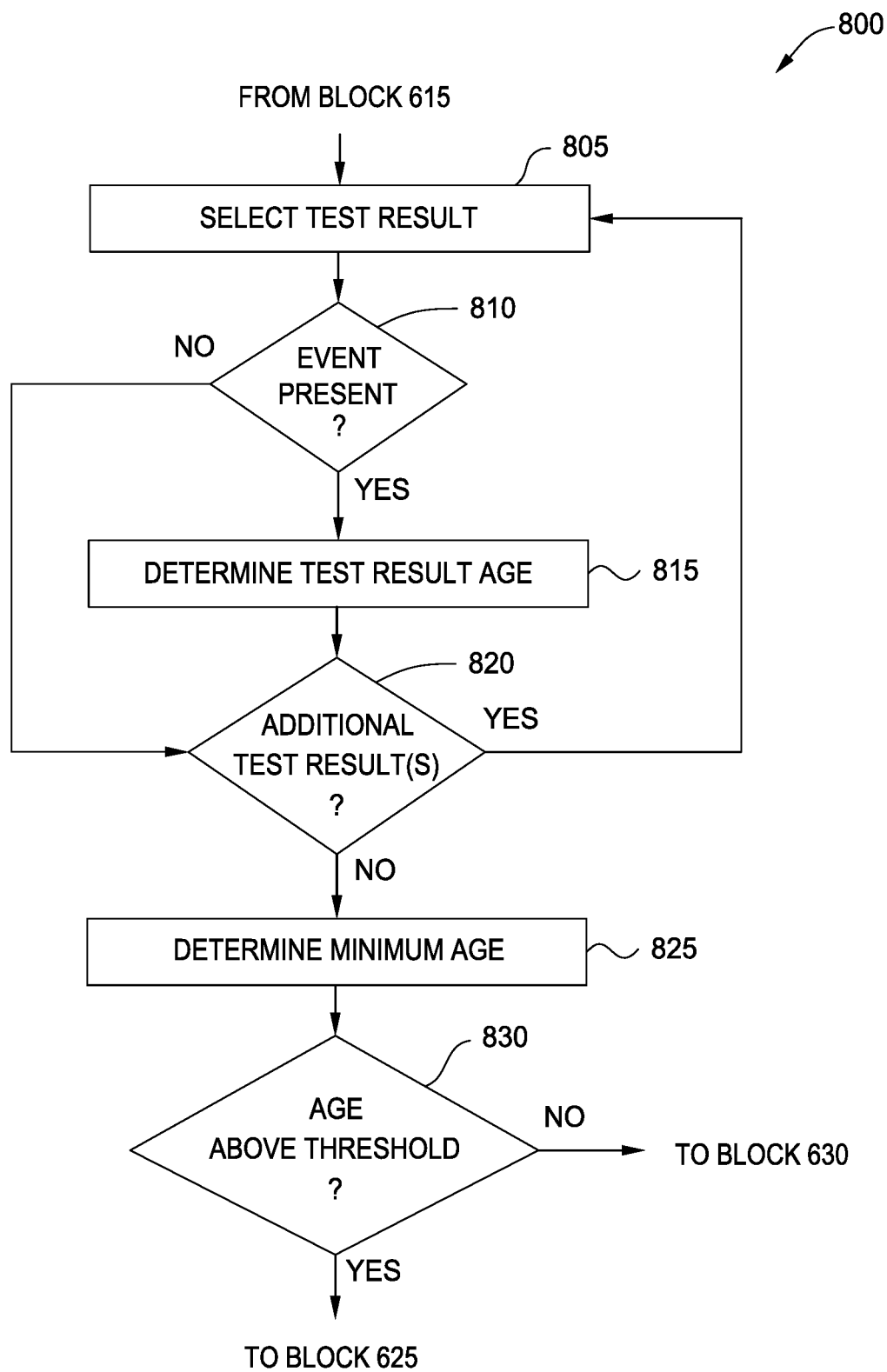
FIG. 8 is a flow diagram illustrating a method of identifying optimal or relevant events for coverage verification, according to one embodiment disclosed herein.

FIG. 8 is a flow diagram illustrating a method 800 of identifying optimal or relevant events for coverage verification, according to one embodiment disclosed herein. In an embodiment, the method 800 may replace block 620 of FIG. 6, and provides additional detail for the criteria evaluation step. The method 800 begins from block 615 of FIG. 6. At block 805, the Event Analyzer 340 selects a first test result in the received test results. The method 800 then proceeds to block 810, where the Event Analyzer 340 determines whether the selected event is present in the selected test result. That is, the Event Analyzer 340 determines whether the selected event was hit, triggered, or covered by the test. If so, the method 800 proceeds to block 815, where the Event Analyzer 340 determines an age of the selected test result. That is, in the illustrated embodiment, the Event Analyzer 340 determines how much time has elapsed since the selected test was simulated or executed. The method 800 then proceeds to block 820. Additionally, if the event was not hit by the selected test result, the method 800 proceeds to block 820.

At block 820, the Event Analyzer 340 determines whether there are additional test results to be considered with respect to the selected event. If so, the method 800 returns to block 805 to select the next test result. Otherwise, the method 800 proceeds to block 825. At block 825, the Event Analyzer 340 determines the minimum age of all of the respective ages for each test result where the event was triggered. That is, in the illustrated embodiment, the Event Analyzer 340 determines how much time has elapsed between the current time and the time at which the event was most recently triggered. The method 800 then proceeds to block 830, where the Event Analyzer 340 determines whether this age is above a predefined threshold. For example, in one embodiment, the Event Analyzer 340 determines whether the event has occurred (in any test result) within a predefined period of time. If not, the event may have "aged out," in that no recent test results have covered it. In the illustrated embodiment, this makes the event an interesting or relevant event for coverage verification purposes.

If the age exceeds the defined threshold, the method 800 proceeds to block 625 of FIG. 6. Otherwise, the method 800 continues to block 630 of FIG. 6. In the illustrated embodiment, the criteria relates to whether the event has occurred sufficiently recently, or has not occurred sufficiently recently. In some embodiments, the criteria may include a determination as to whether the computational logic being tested has been modified, refined, or changed since the last time the event occurred. In embodiments, the criteria utilized can vary based on the particular design needs, as well as based on input from the Users 105.

Figure 9:
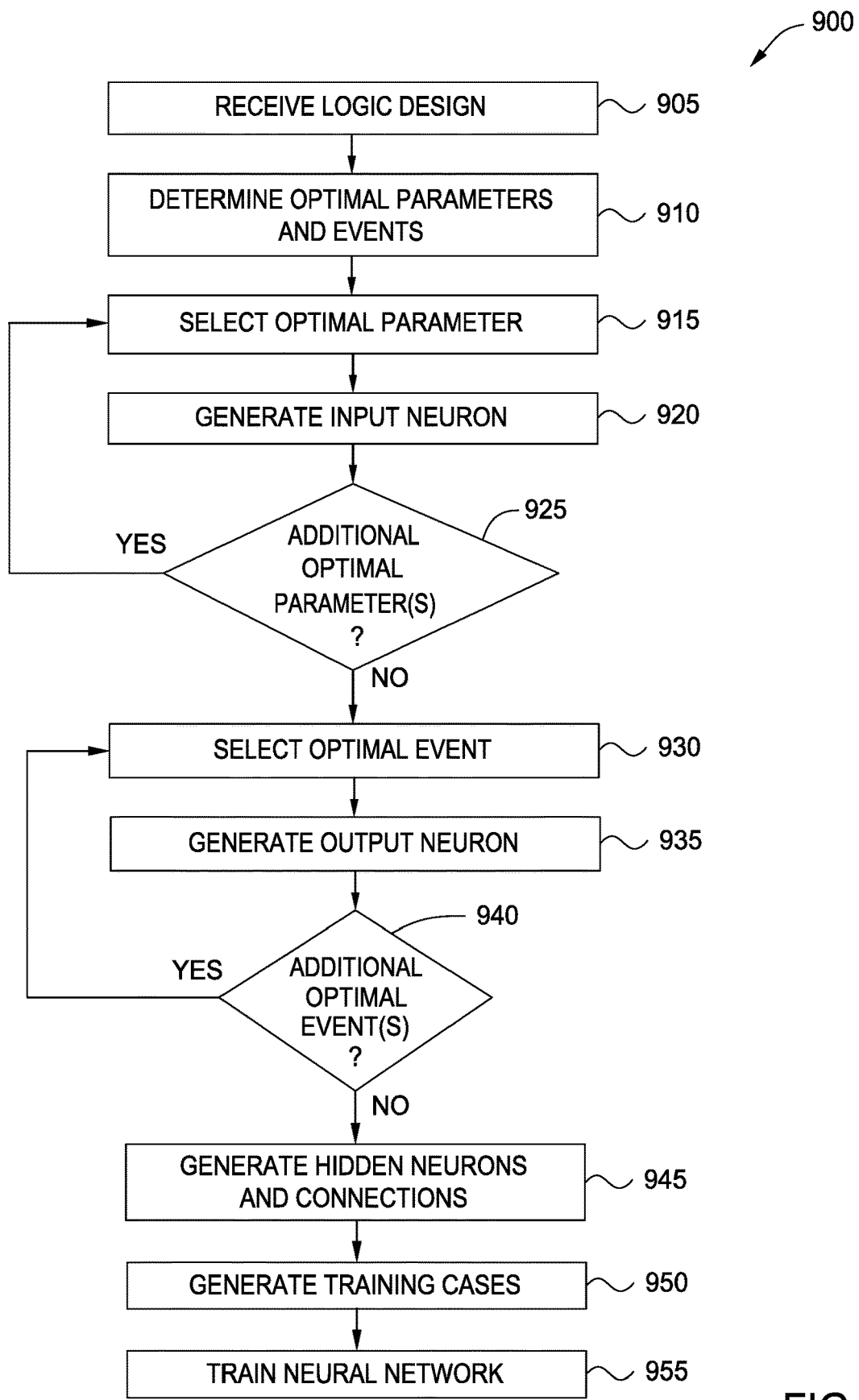
FIG. 9 is a flow diagram illustrating a method of generating and training an optimized neural network for performing coverage verification, according to one embodiment disclosed herein.

FIG. 9 is a flow diagram illustrating a method 900 of generating and training an optimized neural network for performing coverage verification, according to one embodiment disclosed herein. The method 900 begins at block 905, where the Optimization Application 330 receives a computational logic design that is being tested. The method 900 proceeds to block 910, where the Optimization Application 330 determines the optimal set of parameters and events, as discussed above. At block 915, the Verification Application 345 selects a first optimal parameter. The method 900 then proceeds to block 920, where the Verification Application 345 generates an input neuron for the selected parameter. The method 900 then proceeds to block 925, where the Verification Application 345 determines whether there are additional optimal parameters to be included in the NN. If so, the method 900 returns to block 915 to select the next parameter. Otherwise, the method 900 proceeds to block 930.

At block 930, the Verification Application 345 selects one of the optimal events determined above. At block 935, the Verification Application 345 generates an output neuron for the selected optimal event. The method 900 then proceeds to block 940, where the Verification Application 345 determines whether there are additional optimal events to be included. If so, the method 900 returns to block 930, where the Verification Application 345 selects the next event. Otherwise, the method 900 proceeds to block 945. Advantageously, by using the method 900, the size and complexity of the NN is reduced. For example, rather than generate an input neuron for every possible parameter and an output neuron for every possible event, embodiments of the present disclosure enable the intelligent reduction of the data space to only include the relevant, important, or interesting parameters and events. This can significantly reduce the time and computing resources needed to train and use the NN.

At block 945, the Verification Application 345 generates the hidden neurons (e.g., in the middle or hidden layers), and generates the connections for the neurons together. As discussed above, in embodiments, each layer may or may not be fully connected, depending on the particular implementation. The method 900 then proceeds to block 950, where the Verification Application 345 generates training cases for the newly generated NN. In one embodiment, the Verification Application 345 converts each of the test results to a training case by eliminating all parameters and events that were not included in the optimal determination, and creating a parameter vector and an event vector based on the respective test result.

The method 900 then proceeds to block 955, where the Verification Application 345 trains the NN. In an embodiment, to train the NN, the Verification Application 345 provides a training case's parameter vector as input to the NN, and uses backpropagation of the training case's event vector in order to adjust one or more weights included in the NN. This process is repeated for each available training case. In some embodiments, once all training cases have been ingested in this manner, the entire process may be iteratively repeated one or more times.

Once the NN is fully trained, Users 105 can utilize the NN to process a reduced parameter and event space, which enables more efficient and rapid exploration of the possible coverage achieved by each new test than if a full simulation was required for each test. Further, because the data space is reduced (in terms of the number of parameters and/or the number of events), embodiments of the present disclosure improve the efficiency of the verification process, as compared to utilizing an ordinary neural network that considers the entire data space. Specifically, by identifying particularly relevant parameters and events, embodiments of the present disclosure enable the configuration of the neural network to be changed in a way that reduces its size and complexity. This can dramatically reduce the time and computing resources needed to generate, train, and use the NN.

Figure 10:
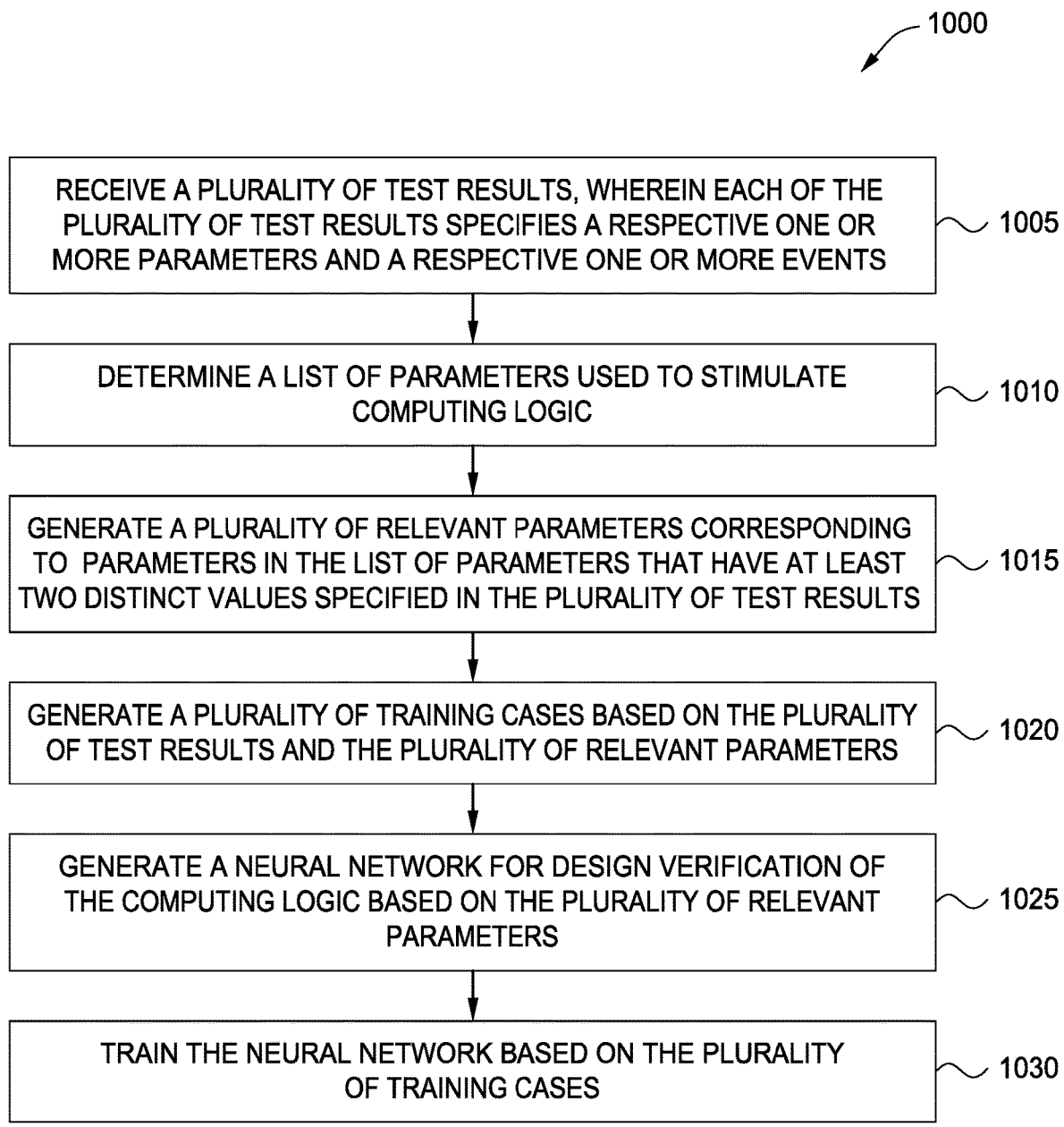
FIG. 10 is a flow diagram illustrating a method for analysis of verification parameters for training reduction, according to one embodiment disclosed herein.

FIG. 10 is a flow diagram illustrating a method for analysis of verification parameters for training reduction, according to one embodiment disclosed herein. The method 1000 begins at block 1005, where the Optimization Application 330 receives a plurality of test results, wherein each of the plurality of test results specifies a respective one or more parameters and a respective one or more events. The method 1000 then continues to block 1010, where the Optimization Application 330 determines a list of parameters used to stimulate computing logic. Additionally, at block 1015, the Optimization Application 330 generates a plurality of relevant parameters corresponding to parameters in the list of parameters that have at least two distinct values specified in the plurality of test results. The method 1000 proceeds to block 1020, where the Optimization Application 330 and/or the Verification Application 345 generates a plurality of training cases based on the plurality of test results and the plurality of relevant parameters. Further, at block 1025, the Verification Application 345 generates a neural network for design verification of the computing logic based on the plurality of relevant parameters. Finally, at block 1030, the Verification Application 345 trains the neural network based on the plurality of training cases.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the preceding features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications (e.g., the Optimization Application 330 and/or the Verification Application 345) or related data available in the cloud. For example, the Optimization Application 330 could execute on a computing system in the cloud and analyze verification parameters for reduction of the training space. In such a case, the Optimization Application 330 could analyze simulation tests and store reduced data space (e.g., optimized parameters and events) at a storage location in the cloud. Doing so allows a user to access this information from any computing system attached to a network connected to the cloud (e.g., the Internet).

While the foregoing is directed to embodiments of the present invention, other and further embodiments of the invention may be devised without departing from the basic scope thereof, and the scope thereof is determined by the claims that follow.

What is claimed is:

1. A method comprising:
receiving a plurality of test results, wherein each of the plurality of test results specifies a respective one or more parameters and a respective one or more events;
determining a list of parameters used to stimulate computing logic;
generating a plurality of relevant parameters by identifying parameters in the list of parameters that have at least two distinct values specified in the plurality of test results;
generating a plurality of training cases based on the plurality of test results and the plurality of relevant parameters;
determining a list of events that are monitored when the computing logic is stimulated;
determining occurrence data by, for each respective event in the list of events, determining a respective number of times the respective event occurs in the plurality of test results;
identifying a plurality of rare events based on comparing the occurrence data to a predefined threshold;
generating a neural network for design verification of the computing logic based on the plurality of relevant parameters; and
training the neural network based on the plurality of training cases and the identified plurality of rare events.

2. The method of claim 1, wherein generating the neural network comprises creating a respective input neuron for each of the plurality of relevant parameters and a respective output neuron for each of the plurality of rare events.

3. The method of claim 1, the method further comprising:
determining a list of events that are monitored when the computing logic is stimulated;
determining age data by, for each respective event in the list of events, determining how recently the respective event was observed in the plurality of test results; and
identifying a plurality of old events based on comparing the age data to a predefined value, wherein training the neural network is further based on the identified plurality of old events.

4. The method of claim 3, wherein generating the neural network comprises creating a respective input neuron for each of the plurality of relevant parameters and a respective output neuron for each of the plurality of old events.

5. The method of claim 1, wherein each of the plurality of test results are generated by simulating the computing logic using the respective one or more parameters.

6. The method of claim 5, wherein the respective one or more events specified in each of the plurality of test results correspond to predefined events that occurred when the computing logic was simulated using the one or more parameters.

7. The method of claim 5, wherein the computing logic comprises a circuit design.

8. The method of claim 7, the method further comprising:
generating a validation result by processing a set of input parameters using the neural network;
modifying the circuit design based on the validation result; and
facilitating fabrication of an integrated circuit based on the modified circuit design.

9. A computer program product comprising:
a computer-readable storage medium having computer-readable program code embodied therewith, the computer-readable program code executable by one or more computer processors to perform an operation comprising:

receiving a plurality of test results, wherein each of the plurality of test results specifies a respective one or more parameters and a respective one or more events;

determining a list of parameters used to stimulate computing logic;

generating a plurality of relevant parameters by identifying parameters in the list of parameters that have at least two distinct values specified in the plurality of test results;

generating a plurality of training cases based on the plurality of test results and the plurality of relevant parameters;

determining a list of events that are monitored when the computing logic is stimulated;

determining occurrence data by, for each respective event in the list of events, determining a respective number of times the respective event occurs in the plurality of test results;

identifying a plurality of rare events based on comparing the occurrence data to a predefined threshold;

generating a neural network for design verification of the computing logic based on the plurality of relevant parameters; and training the neural network based on the plurality of training cases and the identified plurality of rare events.

10. The computer program product of claim 9, wherein generating the neural network comprises creating a respective input neuron for each of the plurality of relevant parameters and a respective output neuron for each of the plurality of rare events.

11. The computer program product of claim 9, the operation further comprising:

determining a list of events that are monitored when the computing logic is stimulated;

determining age data by, for each respective event in the list of events, determining how recently the respective event was observed in the plurality of test results; and identifying a plurality of old events based on comparing the age data to a predefined value, wherein training the neural network is further based on the identified plurality of old events.

12. The computer program product of claim 11, wherein generating the neural network comprises creating a respective input neuron for each of the plurality of relevant parameters and a respective output neuron for each of the plurality of old events.

13. The computer program product of claim 9, the operation further comprising:

generating a validation result by processing a set of input parameters using the neural network;

modifying a circuit design based on the validation result; and facilitating fabrication of an integrated circuit based on the modified circuit design.

14. A system comprising:

one or more computer processors; and a memory containing a program which when executed by the one or more computer processors performs an operation, the operation comprising:

receiving a plurality of test results, wherein each of the plurality of test results specifies a respective one or more parameters and a respective one or more events;

determining a list of parameters used to stimulate computing logic;

generating a plurality of relevant parameters by identifying parameters in the list of parameters that have at least two distinct values specified in the plurality of test results;

generating a plurality of training cases based on the plurality of test results and the plurality of relevant parameters;

determining a list of events that are monitored when the computing logic is stimulated;

determining occurrence data by, for each respective event in the list of events, determining a respective number of times the respective event occurs in the plurality of test results;

identifying a plurality of rare events based on comparing the occurrence data to a predefined threshold;

generating a neural network for design verification of the computing logic based on the plurality of relevant parameters; and training the neural network based on the plurality of training cases and the identified plurality of rare events.

15. The system of claim 14 wherein generating the neutral network comprises creating a respective input neuron for each of the plurality of relevant parameters and a respective output neuron for each of the plurality of rare events.

16. The system of claim 14, the operation further comprising:

determining a list of events that are monitored when the computing logic is stimulated;

determining age data by, for each respective event in the list of events, determining how recently the respective event was observed in the plurality of test results; and identifying a plurality of old events based on comparing the age data to a predefined value, wherein training the neural network is further based on the identified plurality of old events.

17. The system of claim 16, wherein generating the neural network comprises creating a respective input neuron for each of the plurality of relevant parameters and a respective output neuron for each of the plurality of old events.

* * * * *